United States Patent
Shigyou et al.

(10) Patent No.: US 11,892,100 B2
(45) Date of Patent: Feb. 6, 2024

(54) DIAPHRAGM VALVE, FLOW CONTROL DEVICE, FLUID CONTROL DEVICE, AND SEMICONDUCTOR MANUFACTURING DEVICE

(71) Applicant: FUJIKIN INCORPORATED, Osaka (JP)

(72) Inventors: Kohei Shigyou, Osaka (JP); Takashi Hirose, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 0 days.

(21) Appl. No.: 17/782,769

(22) PCT Filed: Dec. 7, 2020

(86) PCT No.: PCT/JP2020/045391
§ 371 (c)(1),
(2) Date: Jun. 6, 2022

(87) PCT Pub. No.: WO2021/131631
PCT Pub. Date: Jul. 1, 2021

(65) Prior Publication Data
US 2023/0003306 A1    Jan. 5, 2023

(30) Foreign Application Priority Data
Dec. 27, 2019 (JP) .................. 2019-238214

(51) Int. Cl.
*F16K 7/16* (2006.01)
*F16K 31/00* (2006.01)
*C23C 16/455* (2006.01)

(52) U.S. Cl.
CPC .............. *F16K 7/16* (2013.01); *F16K 31/007* (2013.01); *C23C 16/45544* (2013.01)

(58) Field of Classification Search
CPC .......... F16K 7/14; F16K 7/16; F16K 27/0236; F16K 31/007
See application file for complete search history.

(56) References Cited

U.S. PATENT DOCUMENTS

| 4,989,277 A | * | 2/1991 | Tsutsui | .................. F16K 31/007 4/406 |
| 2004/0069963 A1 | | 4/2004 | Mattes et al. | |

(Continued)

FOREIGN PATENT DOCUMENTS

| CN | 209164708 U | 7/2019 |
| JP | H 06-66389 A | 3/1994 |

(Continued)

OTHER PUBLICATIONS

Machine English translation of JP-11173440-A (Year: 2023).*

(Continued)

*Primary Examiner* — Hailey K. Do
(74) *Attorney, Agent, or Firm* — Greenblum & Bernstein, P.L.C.

(57) ABSTRACT

A diaphragm valve including: a valve body having a flow path formed therein and a valve chamber recessed from an upper surface of the valve body; a diaphragm that is disposed in the valve chamber and elastically deformable to open and close the flow path and adjust an opening degree of the flow path; a stem for pressing the diaphragm to elastically deform the diaphragm; an actuator for driving the stem; a support mechanism that is fixed to the valve body and supports the stem and the actuator; wherein the stem includes a first stem member connected to the actuator via a displacement transmitting member, and a second stem member held by the support mechanism so as to be movable in (Continued)

the axial direction via a sleeve, the second stem member has an upper end portion which abuts against a lower end portion of the first stem member.

6 Claims, 6 Drawing Sheets

(56) References Cited

U.S. PATENT DOCUMENTS

| | | | | |
|---|---|---|---|---|
| 2015/0369378 | A1* | 12/2015 | Umeyama | G05D 7/0635 |
| | | | | 137/486 |
| 2016/0047483 | A1* | 2/2016 | Hirose | F16K 27/0236 |
| | | | | 137/602 |
| 2016/0363231 | A1* | 12/2016 | Yasumoto | H10N 30/02 |
| 2018/0240961 | A1 | 8/2018 | Shigyou et al. | |

FOREIGN PATENT DOCUMENTS

| | | |
|---|---|---|
| JP | 11-173440 A | 6/1999 |
| JP | 2003-120461 A | 4/2003 |
| JP | 2012-189165 A | 10/2012 |
| JP | 2017-44321 A | 3/2017 |
| JP | 2017-57911 A | 3/2017 |
| JP | WO2017/033423 A1 | 3/2017 |
| KR | 10-2017-0134678 A | 12/2017 |
| TW | 201937093 A | 9/2019 |

OTHER PUBLICATIONS

Machine English translation of WO-2017033423-A1 (Year: 2023).*
International Search Report in WIPO Patent Application No. PCT/JP2020/045391, dated Mar. 2, 2021, along with an English translation thereof.
Korean Office Action in countepan Korean Application No. KR10-2022-7019232, dated Oct. 19, 2023.

* cited by examiner

[fig.1]
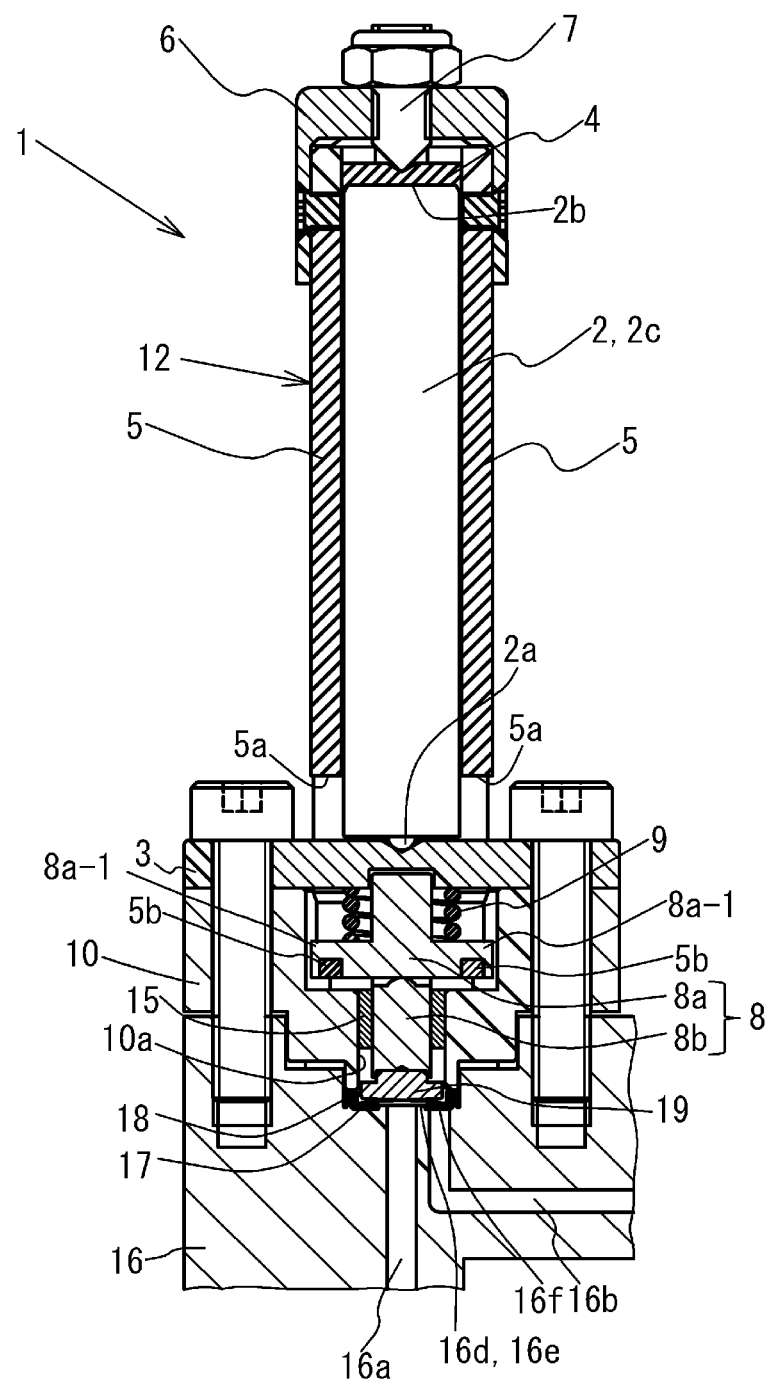

[fig.2]
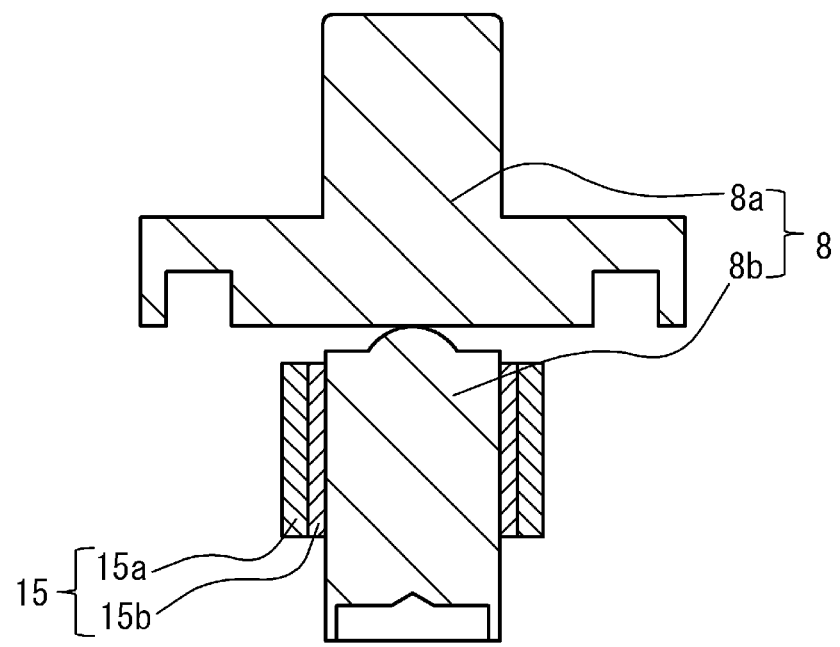

[fig.3]
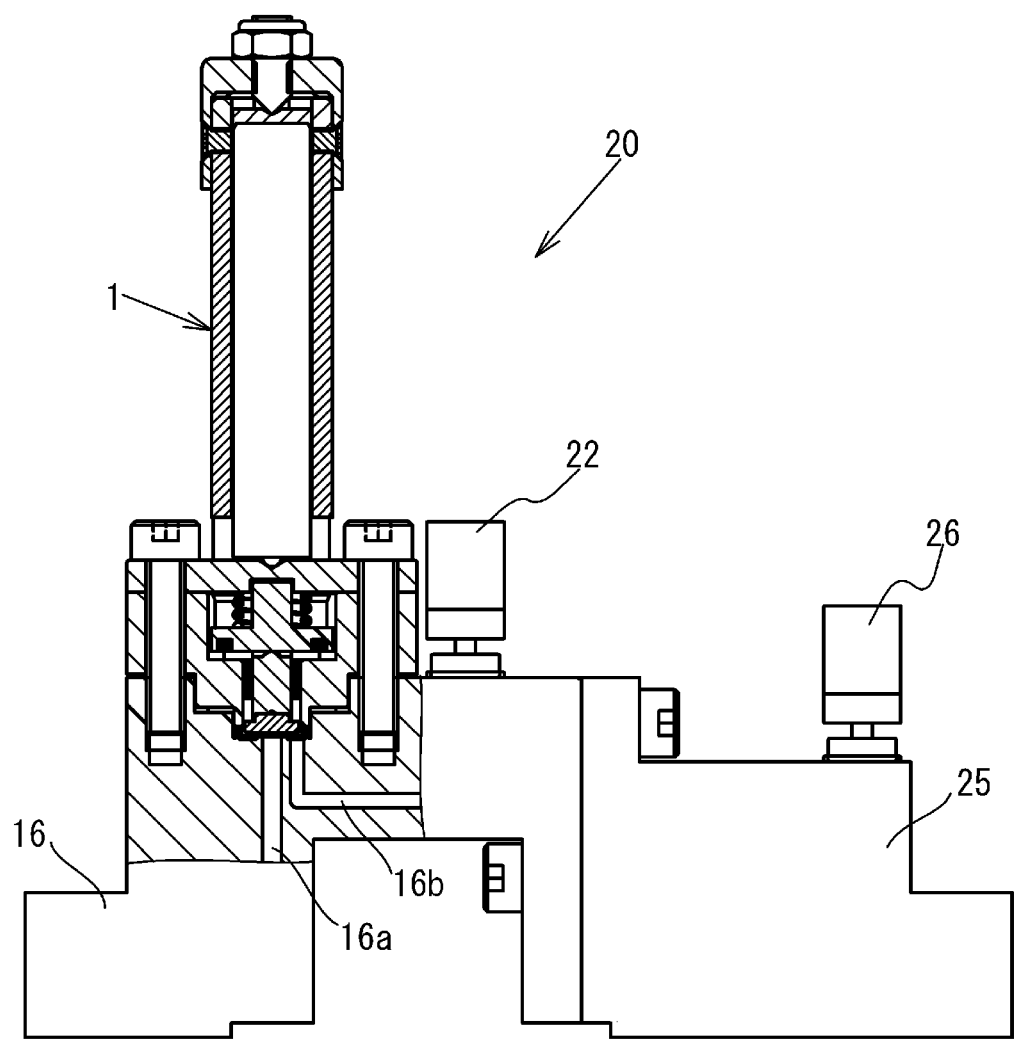

[fig.4]
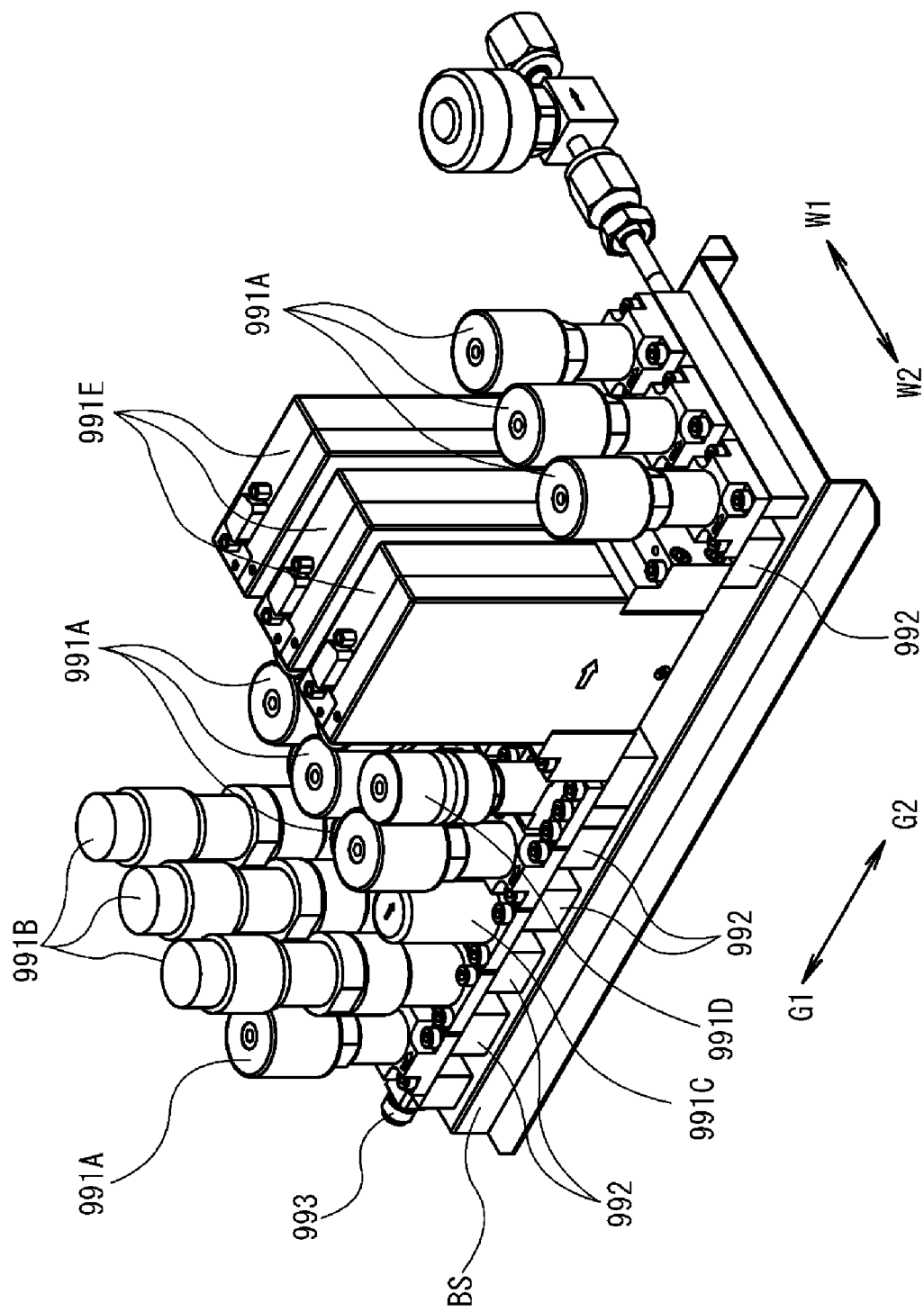

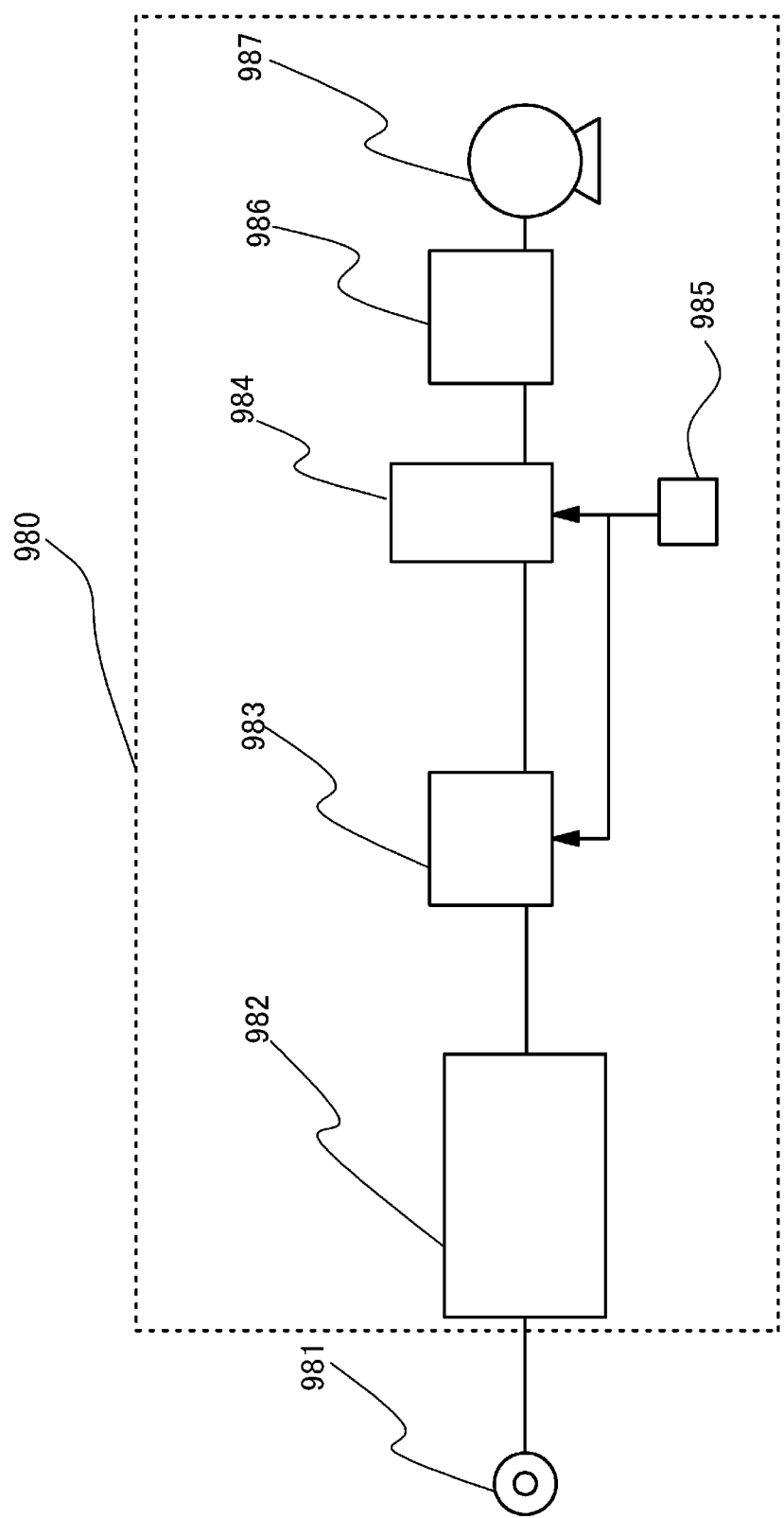
[fig.5]

[fig.6]
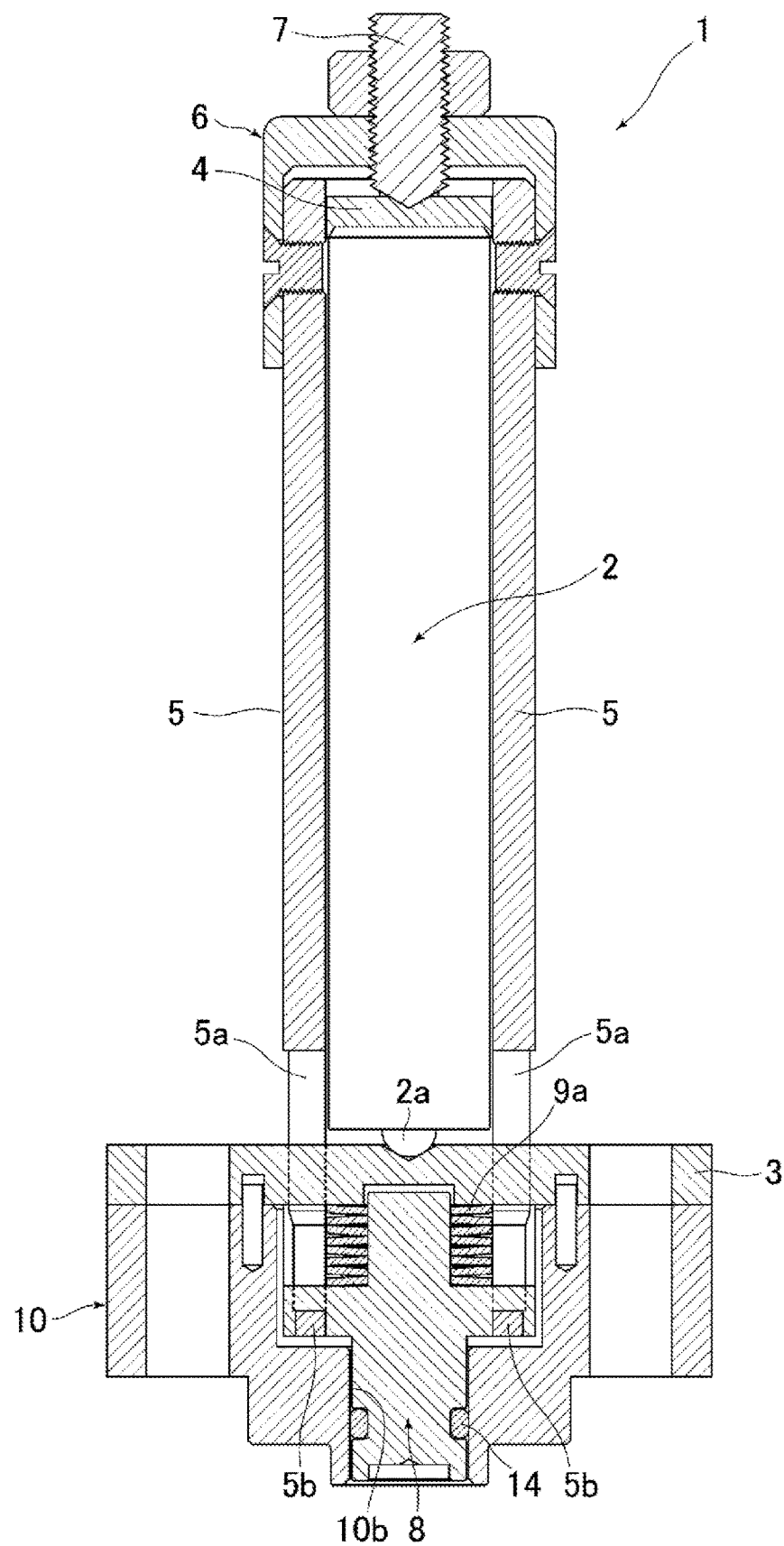

DIAPHRAGM VALVE, FLOW CONTROL DEVICE, FLUID CONTROL DEVICE, AND SEMICONDUCTOR MANUFACTURING DEVICE

TECHNICAL FIELD

The present invention relates to a diaphragm valve, a flow control device, a fluid control device, and a semiconductor manufacturing device.

BACKGROUND ART

For flow control of process gases used in semiconductor manufacturing processes or the like, mass flow controllers are widely used. Such a mass flow controller, for example, in the case of a pressure type mass flow controller, is configured to measure a mass flow rate by using pressures in front and back of an orifice provided in a flow path, and adjust the mass flow rate by a control valve so that the mass flow rate becomes a target value. As such control valves, diaphragm valves are widely used.

The diaphragm valve has a construction in which a drive unit presses a diaphragm made of a thin metal plate or the like to elastically deform the diaphragm to open and close the flow path and adjust the opening degree. The drive unit includes, for example, as shown in FIG. 6 (FIG. 4 of Patent Literature 1), a stem 8 for pressing the diaphragm (reference numeral 17 in FIG. 1), and a piezoelectric actuator 2 for driving it. When a voltage is applied, the piezoelectric actuator 2 is configured to extend, and the stem 8 is driven in a direction to open the valve by the piezoelectric actuator 2 via a displacement transmission mechanism (4, 7, 6, 5, 5b). On the other hand, when the voltage of the piezoelectric actuator 2 is not applied, the stem 8 is biased by a disc spring 9a in a direction to close the diaphragm valve, thereby, to realize a normally closed operation. The stem 8 is guided by a through hole 10b of a bonnet 10 via an O-ring 14 (Patent Literature 1).

This O-ring 14 is formed of rubber such as nitrile rubber, fluororubber, silicon rubber, or chloroprene rubber, and has flexibility. Since the operating stroke of the stem 8 driven by the piezoelectric actuator 2 is as small as several 10 μm, it is considered that the axial displacement of the stem 8 is allowed by elastic deformation of the O-ring 14 rather than sliding.

PATENT LITERATURE

PTL 1: International Publication No. WO2017/033423A1

SUMMARY OF THE INVENTION

Technical Problem

However, in the above mechanism, since the contact area of the O-ring as a guide is small, the holding force is insufficient, and there is a case where axis shake of the stem occurs. As a result, if the abutting portion of the stem in the diaphragm becomes eccentric, the stress becomes high, and it may cause shortening the life of the diaphragm. Especially, when the diaphragm is miniaturized along with miniaturization of flow control devices, even a slight axis shake causes a relatively large eccentricity for the diaphragm, and more severe suppression of the axis shake is required.

Therefore, it is also conceivable to replace the O-ring with a metal sleeve having a high holding force as a guide to reduce the axis shake. However, since the sleeve is arranged within the range of the bonnet 10, the axial length is short, and when an external force is applied to the long displacement transmission mechanism (4, 7, 6, 5, 5b) coupled to the stem, there is a problem that an excessive reaction force is applied to the sleeve and it is easily damaged (easily stuck), and as a result, there may occur trouble in adjustment of the opening degree of the valve.

An object of the present invention is to solve the above-mentioned problems and to provide a diaphragm valve in which axis shake of a stem is reduced.

Solution to Problem

A diaphragm valve of the present invention comprises: a valve body having a flow path formed therein and a valve chamber recessed from an upper surface of the valve body; a diaphragm that is disposed in the valve chamber and elastically deformable to open and close the flow path and adjust an opening degree of the flow path; a stem for pressing the diaphragm to elastically deform the diaphragm; an actuator for driving the stem; and a support mechanism that is fixed to the valve body and supports the stem and the actuator;

the stem and the actuator being arranged in series in this order from the upper surface of the valve body in a direction perpendicular to the upper surface, the actuator being positioned such that a lower end portion abuts on a member of the support mechanism and a vertical position of an upper end portion is movable, the upper end portion of the actuator and the stem being connected via a displacement transmitting member extending so as to bypass the actuator, wherein the stem comprises a first stem member connected to the displacement transmitting member and a second stem member held by the support mechanism so as to be movable in an axial direction via a sleeve, the second stem member has an upper end portion which abuts against a lower end portion of the first stem member, and is driven by the first stem member to press the diaphragm.

With this configuration, since a moment due to an external force applied to the first stem member connected to the displacement transmitting member is not transmitted to the second stem member, it is possible to use a sleeve having a high guide-rigidity as a guide for the second stem member, the diaphragm valve with reduced axis shake of the stem can be realized.

Preferably, a configuration may be adopted in which the sleeve is made of metal and has a resin layer formed on an inner circumferential side.

With this configuration, since the low frictional resistance due to the high guide rigidity and the self-lubricating property of the resin layer is obtained, it is possible to smoothly move the second stem member.

Preferably, a configuration may be adopted in which the resin layer may be made of any one of polyacetal, ultrahigh molecular weight polyethylene, fluororesin, and phenol resin.

Preferably, a configuration may be adopted in which the upper end portion of the second stem member is in point contact with the lower end portion of the first stem member.

With this configuration, even if an external force is applied to the displacement transmitting member and the first stem member is swung, it is possible to suppress fluctuation in the axial position of the second stem member.

Preferably, a configuration may be adopted in which the actuator is a piezoelectric actuator that is configured to be elongated by voltage application.

A flow rate control device of the present invention is one comprising a diaphragm valve having the above configuration.

A fluid control device of the present invention is a fluid control device comprising a plurality of fluid devices arranged from upstream to downstream, wherein the plurality of fluid devices includes a diaphragm valve or a flow rate control device having the above configuration.

A semiconductor manufacturing apparatus of the present invention is one comprising a diaphragm valve or a flow rate control device having the above configuration to control a process gas in a manufacturing process of a semiconductor device requiring a process step using the process gas in a sealed chamber.

Advantageous Effects of Invention

According to the present invention, since the stem is divided into a first stem member connected to a displacement transmitting member and a second stem member for pressing the diaphragm, and only the second stem member is guided by the sleeve in the axial direction, even if a moment due to an external force is applied to the first stem member, it is not transmitted to the second stem member. Therefore, it is possible to use a sleeve having a high guide rigidity as a guide for the second stem member, and a diaphragm valve with reduced axis shake of the stem can be realized.

BRIEF DESCRIPTION OF DRAWINGS

FIG. 1 is a schematic cross-sectional view of a diaphragm valve according to an embodiment of the present invention.

FIG. 2 is an enlarged view showing a stem and a sleeve of the diaphragm valve in FIG. 1.

FIG. 3 is a partial cross-sectional view of a flow rate control device according to an embodiment of the present invention.

FIG. 4 is a schematic perspective view of a fluid control device according to an embodiment of the present invention.

FIG. 5 is a block diagram of a semiconductor manufacturing apparatus according to an embodiment of the present invention.

FIG. 6 is a longitudinal sectional view showing a linear actuator portion of a conventional diaphragm valve.

DESCRIPTION OF EMBODIMENTS

Embodiments of the present invention will be described below with reference to the drawings. FIG. 1 shows a schematic diagram of a diaphragm valve 1 according to an embodiment of the present invention.

As shown in FIG. 1, the diaphragm valve 1 of the present embodiment is configured to include a valve body 16, a diaphragm 17, a support mechanism (3, 10), a stem 8, and an actuator 2.

The valve body 16 has a substantially block shape, and has an upstream side flow path 16a and the downstream side flow path 16b formed therein. The upstream side flow path 16a opens to a central portion of a bottom surface of a valve chamber 16d which is a shallow counterbore-shaped recess formed from an upper surface of the valve body 16, and the periphery of the opening is raised annularly to form a valve seat 16e. On the other hand, the downstream side flow path 16b is open to the peripheral portion 16f of the bottom surface of the valve chamber 16d.

In the present embodiment, the diaphragm 17 is a spherical shell-shaped member made of a metal thin plate such as special stainless steel or a nickel-cobalt alloy thin plate the central portion of which is bulged upward, and is disposed in the valve chamber 16d in the upper surface of the valve body 16. An annular-shaped pressor adapter 18 is disposed on the outer peripheral edge portion of the diaphragm 17, the lower end portion of the bonnet 10 abuts on the pressor adaptor 18, and the bonnet 10 is fastened together with the support plate 3 to the valve body 16 by bolts, so that the diaphragm 17 is fixed and the valve chamber 16d is airtightly sealed.

When the diaphragm valve 1 is open, there is a predetermined amount of gap between the diaphragm 17 and the valve seat 16e, and a flow path is formed in which the upstream side flow path 16a communicates through the gap with the valve chamber 16d sealed with the diaphragm 17, and further communicates with the downstream side flow path 16b. When the diaphragm 17 is pressed by the driving unit 12 and abuts against the valve seat 16e, the communication between the upstream side flow path 16a and the downstream side flow path 16b is shut off, and when the diaphragm 17 is isolated from the valve seat 16e, the upstream side flow path 16a communicates with the downstream side flow path 16b. This makes it possible to open and close the flow path and adjust the opening degree.

The support mechanism (3, 10) is fixed to the valve body 16 to support the stem 8 and the actuator 2, and has a bonnet 10 and a support plate 3.

The bonnet 10 has a shape of substantially cylindrical member with a flange, from which both sides in a vertical direction to the document plane in FIG. 1 are cut off to narrow the width, and the stem 8 can be arranged on the inner peripheral side thereof. The support plate 3 is a member which is arranged to bridge on the upper end portion of the bonnet 10 and has a role of receiving and positioning the lower end portion of the actuator 2.

Thus, the stem 8 and the actuator 2 are arranged in this order from the upper surface of the valve body 16, in a vertical direction with respect to the upper surface.

The flange portion of the bonnet 10 and both ends of the support plate 3 are fastened together to the valve body 16 with two bolts. The bonnet 10 also serves to secure the diaphragm 17 to the valve body 16 as described above.

The actuator 2 drives the stem 8, and in the present embodiment, a piezoelectric actuator is used. Hereinafter, it is also referred to as "piezoelectric actuator 2".

The piezoelectric actuator 2 incorporates stacked piezoelectric elements (not shown) in a cylindrical case 2c. The case 2c is made of a metal such as stainless steel alloy, and the end faces of the hemispherical tip end portion 2a side and base end portion 2b side are closed. In the case 2c, by applying a voltage to the stacked piezoelectric elements and thereby extending them, the end face of tip end portion 2a side of the case 2c is elastically deformed, and the hemispherical tip end portion 2a is displaced in the longitudinal direction. That is, in the case 2c, by applying a voltage to stacked piezoelectric elements, the total length from the tip end portion 2a to the base end portion 2b is extended.

The piezoelectric actuator 2 is arranged in the vertical direction so that the tip end portion 2a, that is a lower end portion, is disposed in a vertical direction so as to abut on the support plate 3. The tip end of the tip end portion 2a forms a hemispherical shape, and in the present embodiment, it is adapted to drop into a conical recess formed in the upper surface of the support plate.

On the other hand, the base end portion 2b, which is the upper end portion of the piezoelectric actuator 2, is held by an upper connecting member 6 via a pressing member 4. The upper surface of the pressing member 4 is in contact with the tip of an adjusting screw 7 which is screwed into a screw hole of the upper connecting member 6. The upper connecting member 6 has a substantially U-shape formed by cutting both sides of a faced-down bottomed cylinder, and to the inside thereof, a pair of displacement transmitting members 5 is connected by screws.

The pair of displacement transmitting members 5 is made of a metal material such as an inver material having a small thermal expansion coefficient, and has a shape formed by preparing a cylindrical member fitted the outer peripheral surface of the piezoelectric actuator 2 and slitting the cylindrical member along the longitudinal direction into two. These pair of displacement transmitting members 5 have respective openings 5a into which the support plate 3 is inserted, and their lower portions each extends downwardly and form a engaging portion 5b in the lower end.

The stem 8 presses the diaphragm 17 via the diaphragm presser 19 to elastically deform it, and is arranged through a guide hole 10a of the bonnet 10 coaxially with the piezoelectric actuator 2 on the lower side of the support plate 3.

Here, in the present invention, the stem 8 comprises a first stem member 8a connected to the displacement transmitting member 5, and a second stem member 8b driven by the first stem member 8a to press the diaphragm 17.

The first stem member 8a includes arm portions 8a-1 engaged with respective engaging portions 5b formed on the lower end portions of the pair of displacement transmitting members 5. Further, the first stem member 8a is biased downward by a coil spring 9. When the piezoelectric actuator 2 is extended, the first stem member 8a is also pulled upward by a pair of displacement transmitting members 5 against the biasing force of the coil spring 9. Thus, the displacement of the length of the piezoelectric actuator 2 is transmitted to the first stem member 8a through a series of displacement transmission mechanism (4, 7, 6, 5, 5b) including the displacement transmitting member 5, and the first stem member 8a is adapted to move in the axial direction.

Incidentally, the upper end portion of the first stem member 8a is loosely fitted into a blind hole on the lower surface of the support plate 3, so that the axial movement of the series of displacement transmission mechanism (4, 7, 6, 5, 5b) including the first stem member 8a and the displacement transmitting member 5 is loosely guided.

The second stem member 8b is arranged coaxially with the first stem member 8a so that the upper end portion of the second stem member 8b abuts on the lower end portion of the first stem member 8a. While the lower end portion of the first stem member 8a forms a substantially flat plane, the upper end portion of the second stem member 8b is substantially spherical, and both are in point contact (see FIG. 2). With this configuration, even if an external force is applied to the displacement transmitting member 5 and the first stem member 8a is swung, the fluctuation of the axial position of the second stem member 8b can be minimized. A diaphragm presser 19 is attached to the lower end portion of the second stem member 8b and abuts against the diaphragm 17. The second stem member 8b is driven by the first stem member 8a to press the diaphragm 17 and elastically deform it.

The second stem member 8b is moveably held in the axial direction via the sleeve 15 by the bonnet 10. In the present embodiment, a sleeve 15 is used as a sliding portion between the stem 8 and the guide hole 10a of the bonnet 10 instead of the conventional O-ring 14 (see FIG. 6). That is, the second stem member 8b is guided by the inner periphery of the sleeve 15 whose outer periphery is fitted and fixed to the guide hole 10a of the bonnet 10. As shown in FIG. 2, since the sleeve 15 has a self-lubricating resin layer such as polyacetal, ultra-high molecular weight polyethylene, fluororesin, Teflon (registered trademark) resin, and phenol resin on the inner peripheral side of the sleeve body 15a, the coefficient of friction with the second stem member 8b made of stainless steel to be guided is small. Further, the combination of the outer periphery of the second stem member 8b and the inner periphery of the sleeve 15 forms a cylindrical contact surface, which realizes a wide contact area and high guide rigidity.

Next, the operation of the diaphragm valve 1 of the present embodiment thus configured will be described with reference to FIG. 1.

First, in the initial condition where the voltage applied to the piezoelectric actuator 2 is zero, the length L of the piezoelectric actuator 2 is the initial length L0 the minimum, and the displacement transmission mechanism (4, 7, 6, 5, 5b) and the first stem member 8a which is engaged therewith is pushed down by a coil spring 9 and is in the lowermost position, and the second stem member 8b in contact with this is also in the lowermost position. Therefore, the diaphragm 17 is pressed by the second stem member 8b and comes into close contact with the valve seat 16e, so that the valve is in fully closed state.

Next, when a voltage is applied to the piezoelectric actuator 2, the length L of the piezoelectric actuator 2 is increased, overcoming the biasing force of the coil spring 9, the displacement transmission mechanism (4, 7, 6, 5, 5b) and the first stem member 8a are pulled up. As a result, the second stem member 8b is also pushed up by the shape-restoring force of the diaphragm 17, a gap is formed between the diaphragm 17 and the valve seat 16e, the valve opens, and the fluid can pass through the diaphragm valve 1. By adjusting the applied voltage to the piezoelectric actuator 2, the gap between the diaphragm 17 and the valve seat 16e can be adjusted, and the flow rate of the fluid can be adjusted.

Here, since the stem 8 is divided into a first stem member connected to the displacement transmitting member and a second stem member that presses the diaphragm, even if a moment due to an external force is applied to the first stem member, it is not transmitted to the second stem member.

Therefore, the sleeve 15 having high guide rigidity can be used as a guide for the second stem member 8b. Therefore, it is possible to prevent the axis shake during vertical movement to thereby reduce the stress-increase of the diaphragm 17 due to the axis shake, so that the life of the diaphragm 17 can be improved. Further, since the resin layer 15b having low friction coefficient is formed on the inner peripheral side of the sleeve 15 with which the outer periphery of the second stem member 8b is in contact, the second stem member 8b can be moved in the vertical direction smoothly.

In the present embodiment, the sleeve 15 in which the resin layer 15b is formed on the inner peripheral side of the sleeve body 15a made of metal is used as the guide of the second stem member 8b, but the present invention is not limited thereto. For example, a ball bush having a rolling ball may be used, and even in such a configuration, high guide rigidity and low guide resistance can be realized.

Further, the abutting points between the lower end portion of the first stem member 8a and the upper end portion of the second stem member 8b are formed by making the former a flat plane and the latter a spherical surface to realize point contact, but the present invention is not limited thereto, and the former may be a spherical surface, the latter may be a flat plane, or both may be spherical surfaces. Further, although both ends of the upper end portion of the second stem member 8b are flat and the central portion is a substantially spherical surface, the upper end portion may be a spherical surface as a whole.

Next, a flow rate control device of the present invention will be described.

FIG. 3 is a partial cross-sectional view of a flow rate control device 20 according to an embodiment of the present invention, and shows a pressure type flow rate control device 20 in which the diaphragm valve 1 described above is incorporated.

In FIG. 3, a cover for covering the entire flow rate control device 20 and a feedback control board actually exist, but they are not shown for convenience of explanation.

The flow rate control device 20 includes a downstream side block 25, a pressure detector 22, an orifice (not shown), a pressure detector 26, and a downstream side flow path (not shown) in addition to the above-described components of the diaphragm valve 1.

Inside the valve body 16, an orifice (not shown; in the present embodiment, a gasket-type orifice) is provided in the flow path 16b on the downstream side of the diaphragm 17. In the middle of the flow path 16b on the upstream side of the orifice, an upstream side pressure detector 22 for detecting the pressure is provided.

The downstream side block 25 is connected by bolts to the valve body 16 and has a downstream flow path communicating with the downstream side flow path 16b of the valve body 16 (not shown), and a downstream side pressure detector 26 for detecting the pressure in the flow path is provided.

By a control device (not shown), the diaphragm valve 1 is controlled to open and close by a PID control based on the detected values of the pressure detectors 22 and 26.

In this flow rate control device, since the diaphragm valve of the present invention is used, the life of the fluid control device can be expected to be extended along with extension of the life of the diaphragm valve.

Next, a fluid control device of the present invention will be described.

FIG. 4 is a schematic perspective view of the fluid control device according to an embodiment of the present invention.

The fluid control device shown in FIG. 4 is provided with a metallic baseplate BS arranged along the widthwise directions W1, W2 and extending in the longitudinal directions G1, G2. Note that W1 represents the front side, W2 represents the back side, G1 represents the upstream side, and G2 represents the downstream side. Various fluid devices 991A to 991E are installed on the baseplate BS via a plurality of flow path blocks 992, and a flow path (not shown) through which fluid flows from the upstream side G1 to the downstream side G2 is formed in the plurality of flow path blocks 992.

Here, a "fluid device" is a device used in a fluid control device for controlling a flow of a fluid, the fluid device comprises a body defining a fluid flow path and has at least two flow path ports opening at the surfaces of the body. Specifically, the fluid devices include the open-close valves (2-way valves) 991A, regulators 991B, pressure gauges 991C, open-close valves (3-way valves) 991D, mass flow controllers 991E, and the like, but not limited to thereto. An inlet tube 993 is connected to an upstream flow path port of the flow path (the flow path is not shown).

The present invention can be applied to various diaphragm valves such as the above-described open-close valves 991A and 991D, regulators 991B, and mass flow controllers 991E.

Next, a semiconductor manufacturing apparatus of the present invention will be described.

FIG. 5 is a block diagram of a semiconductor manufacturing apparatus according to an embodiment of the present invention.

The semiconductor manufacturing apparatus 980 shown in FIG. 5 is an apparatus for performing a semiconductor manufacturing process by an atomic layer deposition method (ALD: Atomic Layer Deposition method), where 981 denotes a process gas source, 982 denotes a gas box (fluid control device), 983 denotes a tank, 984 denotes an open-close valve, 985 denotes a control unit, 986 denotes a process chamber, and 987 denotes an exhaust pump.

The present invention is applicable to the above-described fluid devices constituting the gas box 982 and the open-close valve 984.

Note that the present invention is not limited to the above-described embodiment. Various additions, modifications, and the like can be made by those skilled in the art within the scope of the present invention. For example, in the above application example, the case where the present invention is used in the semiconductor manufacturing process by the ALD method is exemplified, but the present invention is not limited to this, and the present invention can be applied to any object requiring precise flow rate control, such as an atomic layer etching (ALE: Atomic Layer Etching method).

In the above embodiment, the open-close valve 984 is configured to be disposed outside the gas box 982 as a fluid control device, but it is also possible to include the diaphragm valve of the above embodiment in the fluid control device in which various fluid devices such as an open-close valve, a regulator, and a mass flow controller are integrated and housed in a box.

REFERENCE SIGNS LIST

1: Diaphragm valve
2: Piezoelectric actuator, Actuator
2a: Tip end portion
2b: Base end portion
2c: Case
3: Support plate (Support mechanism)
4: Pressing member
5: Displacement transmitting member
5a: Opening
5b: Engaging portion
6: Upper connecting member
7: Adjusting screw
8: Stem
8a: First stem member
8a-1: Arm portion
8b: Second stem member
9: Coil spring
10: Bonnet (Support mechanism)
10a: Guide hole
10b: Through hole
12: Driving unit
14: O-ring
15: Sleeve 15*a*: Sleeve body
15*b*: Resin layer
16: Valve body
16*a*: Upstream side flow path, Flow path
16*b*: Downstream side flow path, Flow path
16*d*: Valve chamber
16*e*: Valve seat
17: Diaphragm
18: Presser adapter
19: Diaphragm presser
20: Flow rate control device
22: Pressure detector
25: Downstream side block
26: Pressure detector
980: Semiconductor manufacturing apparatus
981: Process gas source
982: Gas box (fluid control device)
983: Tank
984: Open-close valve
985: Control unit
986: Process chamber
987: Exhaust pump
991A~991E: Fluid device
992: Flow path block
993: Inlet tube
BS: Base plate
G1, G2: Longitudinal direction
W1, W2: Width direction

The invention claimed is:

1. A diaphragm valve comprising: a valve body having a flow path formed therein and a valve chamber recessed from an upper surface of the valve body; a diaphragm that is disposed in the valve chamber and elastically deformable to open and close the flow path and adjust an opening degree of the flow path; a stem for pressing the diaphragm to elastically deform the diaphragm; an actuator for driving the stem; and a support that is fixed to the valve body and supports the stem and the actuator;

the stem and the actuator being arranged in series in this order from the upper surface of the valve body in a direction perpendicular to the upper surface, the actuator being positioned such that a lower end portion abuts on a member of the support and a vertical position of an upper end portion is movable, the upper end portion of the actuator and the stem being connected via a displacement transmitter extending so as to bypass the actuator, wherein the stem comprises a first stem member connected to the displacement transmitter, and a second stem member held by the support so as to be movable in an axial direction via a sleeve, the second stem member has an upper end portion which abuts against a lower end portion of the first stem member, and is driven by the first stem member to press the diaphragm, and wherein the upper end portion of the second stem member is in point contact with the lower end portion of the first stem member.

2. The diaphragm valve according to claim 1, wherein the actuator is a piezoelectric actuator that is configured to be elongated in length by voltage application.

3. A flow rate control device comprising the diaphragm valve as defined in claim 1.

4. A fluid control device comprising a plurality of fluid devices that is arranged,
the plurality of fluid devices including the diaphragm valve as defined in claim 1.

5. The diaphragm valve according to claim 1, wherein the sleeve is made of metal and has a resin layer formed on an inner peripheral side.

6. The diaphragm valve according to claim 5, wherein the resin layer is made of any one of polyacetal, ultrahigh molecular weight polyethylene, fluororesin, and phenol resin.

* * * * *